United States Patent [19]

Spall et al.

[11] Patent Number: 5,517,515
[45] Date of Patent: May 14, 1996

[54] MULTICHIP MODULE WITH INTEGRATED TEST CIRCUITRY DISPOSED WITHIN INTERPOSER SUBSTRATE

[75] Inventors: Edward J. Spall; Thomas M. Storey, both of Manassas, Va.

[73] Assignee: International Business Machines Corporation, Armonk, N.Y.

[21] Appl. No.: 292,120

[22] Filed: Aug. 17, 1994

[51] Int. Cl.⁶ ............................ G01R 31/28; G06F 11/00
[52] U.S. Cl. ................ 371/22.5; 324/73.1; 371/25.1
[58] Field of Search ................... 371/22.5, 25.1, 371/15.1, 15, 22.3; 324/73 R, 158, 158 R; 29/832; 307/465, 475, 219; 364/580

[56] References Cited

U.S. PATENT DOCUMENTS

| | | | |
|---|---|---|---|
| 4,336,495 | 6/1982 | Hapke | 324/158 |
| 4,441,075 | 4/1984 | McMahon | 324/73 R |
| 4,488,259 | 12/1984 | Mercy | 364/900 |
| 4,494,066 | 1/1985 | Goel et al. | 324/73 R |
| 4,503,537 | 3/1985 | McAnney | 371/25 |
| 4,817,093 | 3/1989 | Jacobs et al. | 371/25 |
| 4,855,669 | 8/1989 | Mahoney | 324/73 |
| 4,970,454 | 11/1990 | Stambaugh et al. | 324/73.1 |
| 5,086,558 | 2/1992 | Grube et al. | 29/832 |
| 5,103,450 | 4/1992 | Whetsel | 371/22.1 |
| 5,172,050 | 12/1992 | Swapp | 324/158 |
| 5,173,904 | 12/1992 | Daniels et al. | 371/22.3 |
| 5,173,906 | 12/1992 | Dreibelbis et al. | 371/22.5 |

OTHER PUBLICATIONS

Maunder et al., "The Test Access Port and Boundary–Scan Architecture," IEE Computer Society Press Tutorial, Chap. 4, pp. 33–49, 1990.

Primary Examiner—Robert W. Beausoliel, Jr.
Assistant Examiner—Nadeem Iqbal
Attorney, Agent, or Firm—Heslin & Rothenberg

[57] ABSTRACT

A multichip module (MCM) and associated fabrication technique are presented wherein a test circuit is disposed within the interposer substrate of the MCM to facilitate testing of the module's integrated circuit chips and testing of the interconnect wiring between integrated circuit chips. The test circuitry, disposed within the interposer substrate comprises semiconductor logic circuitry that electrically connects to the integrated circuit chips of the module. In the various multiplexer latch and shift register latch embodiments disclosed, active test circuitry within the interposer substrate is minimized and is essentially transparent to the integrated circuit chip designs incorporated in the MCM.

24 Claims, 5 Drawing Sheets fig. 1 fig. 2 fig. 3 fig. 4 fig. 5 fig. 6 fig. 7 fig. 8 fig. 9

MULTICHIP MODULE WITH INTEGRATED TEST CIRCUITRY DISPOSED WITHIN INTERPOSER SUBSTRATE

TECHNICAL FIELD

This invention relates in general to testing of multichip modules, and more particularly, to multichip modules having integrated test circuitry for facilitating testing of its integrated circuit chips and testing of the interconnect wiring electrically coupling the integrated circuit chips.

BACKGROUND ART

The recent surge in interest in multichip modules (MCMs) is a natural extension of the computer industries' relentless pursuit of high speed computing, with minimal size/weight/power requirements, at a reasonable cost. Such modules allow already highly integrated chips to be closely spaced and yet interact via wide data buses (with high input/output (I/O)), both of which dramatically improve device performance.

For all their advantages, MCMs pose a major testing challenge. Many MCMs can contain over one million transistors, each of which should be tested. Worse yet, test methods traditionally used at the card/board level, where chip leads can be probed directly, are not applicable to MCMs. This can mean an incompletely tested product or excessive test-related costs.

Testing already represents a substantial portion of overall product cost, perhaps as high as fifty (50%) percent. This cost consists of the expense associated with developing the test, and the recurring cost of applying the test to manufactured product. The alternative, reducing present expense by spending less effort to develop an effective test, actually ultimately raises product cost as defective electrical components then slip through undetected and must be weeded out by a board, unit or system test or, even worse, in the field. In general, the higher the level of packaging, the more expensive the cost of diagnosis and repair. Experts have estimated that this cost may increase by a factor of 10× for each level of packaging. This is most likely a conservative estimate, which means that detecting a defective MCM at the unit or system level could be 100 or 1000 times more expensive that detecting the defect immediately during MCM manufacturing. Thus, enhancing MCM testing can be considered critical to profitability of a multichip module manufacturer.

Testing of MCMs is further complicated by the trend towards diversification within the semiconductor computer industry. Specifically, in contrast to prior MCM fabrication facilities in which the integrated circuit chips and MCMs were both designed and tested by the same company, an MCM foundry is today supplied tested chips ("die") and has the sole task of mounting these die on an MCM substrate. In such an environment, the foundry most likely does not have access to the details of the internal circuitry within the supplied die. Thus, a major dilemma is often presented for manufacturing testing.

In addition to any one of the one million or so transistors which may be defective, the MCM mounting process cannot guarantee 100 percent effectiveness, and thus must be verified via testing. Testing must be rigorous, since today's customers demand extremely high quality levels, as measured in number of defective packages per million shipped. Such high quality testing is difficult enough when the chips and MCM are both designed by the same facility, but can be extremely problematic when the chips are designed and fabricated by a semiconductor facility that may consider the design and test patterns to be proprietary.

Currently, two major approaches to solving the problem of testing MCMs have been employed. First, metal pads have been placed on a top surface of an MCM's substrate, surrounding each chip site. Wiring within the carrier substrate provides electrical connection between these pads and the I/O of each integrated circuit chip mounted on the substrate. This technique, similar to in-circuit-testing used at the card and board level of packaging, allows the test(s) applied during wafer fabrication to be reapplied at the MCM level of packaging. Unfortunately, there are several disadvantages to this approach.

First, space must be provided for the pads on a top surface of the MCM substrate, increasing significantly the total size of the MCM. This not only impacts the area taken by the package, but also increases the distance between chips of the MCM, thereby reducing MCM performance. Obviously, close chip spacing is a major objective/advantage to MCMs. Secondly, reliable probing of the mounted chips, and providing cooling for heat generated during testing, are sufficiently difficult that the equipment to perform such testing can cost millions of dollars. Finally, a major portion of defects at the MCM fabrication level can comprise inoperative substrate interconnect circuitry, which cannot be tested using this probing technique.

A second approach to MCM testing is to alter each integrated circuit chip to provide the logical equivalent of the above-discussed chip isolate probing. The most popular embodiment of this approach is described by IEEE Standard 1149.1 (see, e.g., Maunder et al., entitled *"The Test Access Port and Boundary-Scan Architecture," IEEE Computer Society of Press Tutorial,* ch. 4, pp. 33–49 (1990)). In this standard, referred to as boundary-scan, latches are provided at each integrated circuit chip I/O to allow the chip to be independently tested by shifting data into the chip input latches, clocking the chip, and then shifting data out from the chip output latches to determine states propagated through the chip. In contrast to the probing method, substrate interconnections can be tested by shifting data into the latches at a given chip's outputs, performing a chip-to-chip data transfer, and then shifting out the contents of the output latches of the chip fed by the driving chip to ensure that proper electrical continuity exists between the chips.

Boundary-scan is an effective solution to the MCM testing problem where the integrated circuit chips are designed to accommodate such testing. However, many of today's integrated circuit chips do not conform to the standard since the chips were not intended for MCM applications, or were designed prior to the introduction of the IEEE standard. Thus, this invention addresses the broad class of MCMs designed with integrated circuit chips that do not conform to the boundary-scan standard.

DISCLOSURE OF INVENTION

Briefly described, the present invention comprises a multichip module having an interposer substrate upon which a plurality of integrated circuit chips are disposed and electrically connected. Within the interposer substrate is semiconductor logic circuitry that is electrically connected to at least some integrated circuit chips of the plurality of integrated circuit chips. The semiconductor logic circuitry facilitates testing of the multichip module subsequent to fabrication of the module. In the embodiments presented, the logic circuitry comprises a scan string(s) of latches, such as multiplexer (MUX) latches or shift register latches.

In another aspect, the invention comprises a method for fabricating a multichip module including the steps of: forming a semiconductor substrate having test circuitry disposed therein; forming interconnect wiring above the semiconductor substrate such that said interconnect wiring electrically connects with said test circuitry disposed within the semiconductor substrate; and disposing a plurality of integrated circuit chips above the interconnect wiring such that the interconnect wiring electrically interconnects the plurality of integrated circuit chips and electrically connects the test circuitry to at least some integrated circuit chips of the plurality of integrated circuit chips. The test circuitry facilitates testing of the plurality of integrated circuit chips.

To restate, this invention provides test circuitry disposed within the MCM's interposer substrate for MCM fabrication level testing of the integrated circuit chips of the multichip module and for testing the interconnect wiring between the integrated circuit chips. Testability is provided without significantly impacting MCM functionality and performance. Further, no modification to chip design(s) is necessary to accomplish testing in accordance with this invention. Although disposed within the interposer substrate, active test circuitry is minimized. MCM chip testing pursuant to this invention advantageously incorporates existing testing approaches employed at the chip level of packaging.

By taking advantage of the ability to add circuitry to the interposer substrate, it is possible to independently test each integrated circuit chip (as if probe pads were available), without the additional expense of actually contacting the chips from above. Furthermore, the interposer substrate circuitry provides 100% testing of the interconnect circuitry. As opposed to forcing redesign for testability, the approach disclosed herein is essentially transparent to the integrated circuit chip designs, its only effect in some embodiments being the signal propagation delay of a single multiplexer.

BRIEF DESCRIPTION OF DRAWINGS

These and other objects, advantages and features of the present invention will be more readily understood from the following detailed description of certain preferred embodiments of the invention, when considered in conjunction with the accompanying drawings in which.

BEST MODE FOR CARRYING OUT THE INVENTION

Broadly considered, this invention utilizes a powerful aspect of one of the MCM carrier technologies, i.e., silicon-on-silicon. In this technology, the MCM substrate interconnections and chip bonding are provided by a silicon interconnect wafer. This interconnect wafer, referred to herein as an "interposer substrate," can be fabricated using the same manufacturing facilities deployed for semiconductor fabrication. In fact, the same fabrication line can be manufacturing both semiconductor integrated circuit chips and silicon interposer substrates simultaneously.

As described herein, a method and multichip module (MCM) structure are presented to enable testing of the mounted integrated circuit chips of the MCM. More specifically, the silicon interposer substrate design is modified herein to include a limited number of active circuits (transistors) disposed within the interposer substrate itself. These active circuits are designed to provide a means for testing: (a) each mounted integrated circuit chip; (b) the interposer substrate's chip interconnect wiring; and (c), inherently, the active circuits themselves.

Figure 1:
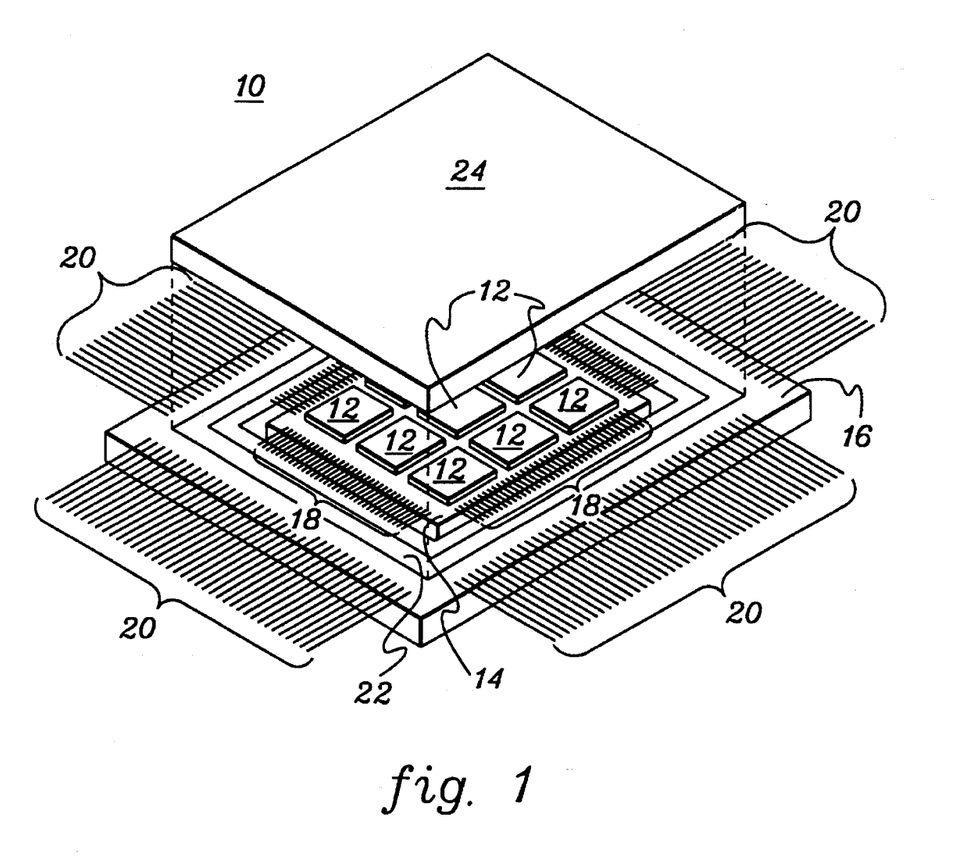
FIG. 1 is a perspective view of a partially exploded multichip module within which test circuitry in accordance with the present invention is disposed.

FIG. 1 presents one embodiment of a multichip module (MCM), generally denoted 10, wherein a plurality of integrated circuit flip-chips 12 are disposed face down above an interposer substrate 14. In this embodiment, substrate 14 resides within a cavity in a support carrier 16. Wire bond interconnections 18 are electrically coupled to the input/outputs (I/O) of integrated circuit chips 12 via multiple layers of interconnect wiring comprising part of interposer substrate 14. Similarly, interconnect wiring within carrier 16 electrically couples wire bonds 18 to I/O leads 20 disposed about the circumference of the multichip module. Carrier 16, which comprises in one embodiment a multi-layered ceramic (MLC) carrier, has a sealing ring 22 to which a cover 24 can be secured to hermetically seal the plurality of integrated circuit chips 12 within the multichip module. As can be appreciated from this figure, most of the integrated circuit chips I/O(s) will not be directly observable/controllable from the MCM package pins 20. Thus, the need for a method and MCM structure which will allow the packaged integrated circuit chips to be fully tested at the MCM manufacturing level.

Figure 2:
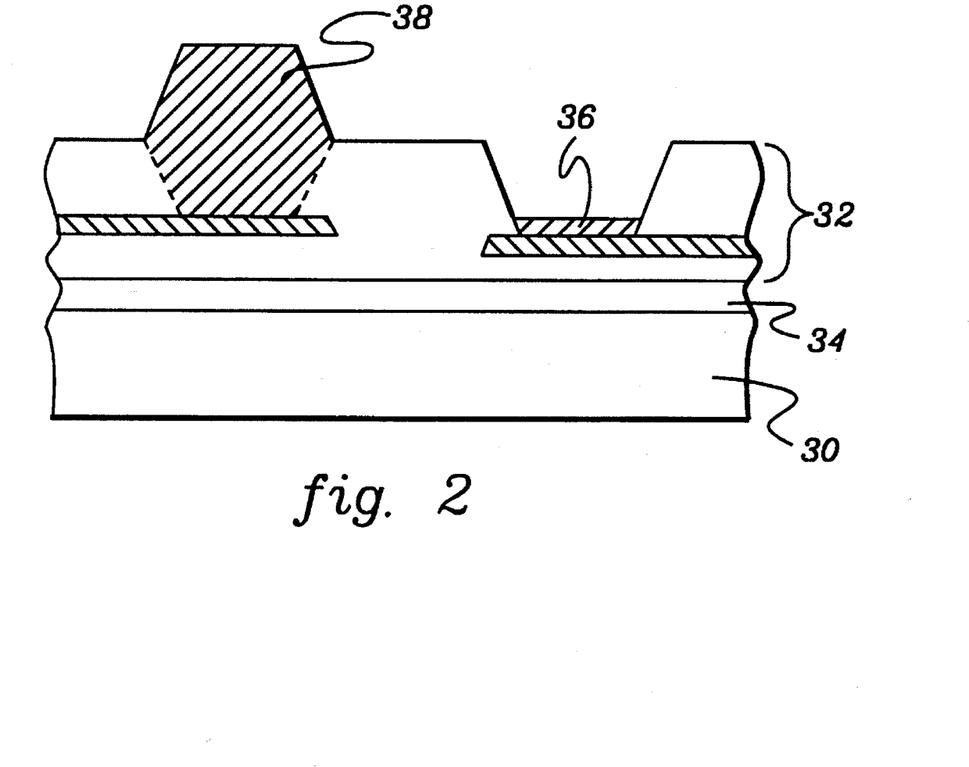
FIG. 2 is a partial cross-sectional view of one embodiment of an interposer substrate for the multichip module of FIG. 1.

Existing silicon-on-silicon MCM fabrication techniques employ a silicon interposer substrate 30 (FIG. 2) as a foundation for the application of a plurality of levels of wiring 32 which together define an electrical interconnection network for the integrated circuit chips ultimately mounted on the interposer substrate, and to package I/O. An isolation layer 34, e.g., comprising silicon dioxide or silicon nitride, separates the silicon substrate from the multiple levels of interconnect wiring 32 disposed thereon. Wiring levels 32 are then successively applied and isolated, for example, with polyimide. Typically, the multiple layers of interconnect wiring 32 will include a VDD plane, a ground plane, and multiple signal planes located therebetween. Disposed at preselected locations will be bonding pads 36 and solder bump connects 38. The integrated circuit chips are electrically coupled to the interposer substrate via a pre-designed array of solder bumps.

Pursuant to the present invention, additional processing steps are employed during the interposer substrate fabrication stage to add an embedded active semiconductor circuit (using transistors) in the silicon wafer prior to the formation of interconnect wirings 32. In a complementary metal oxide semiconductor (CMOS) implementation of this approach, N-channel metal oxide semiconductor (NMOS) and P-channel metal oxide semiconductor (PMOS) devices are created via standard semiconductor processes of dose implant, polysilicon deposition, etching, photolithography, etc. One representation of this is presented in FIG. 3, wherein an active circuit layer 42 is shown to be formed within a silicon interposer substrate 40. Again, an isolation layer 34 electrically separates the multiple layers of interconnection wiring 32 from the silicon substrate.

Figure 3:
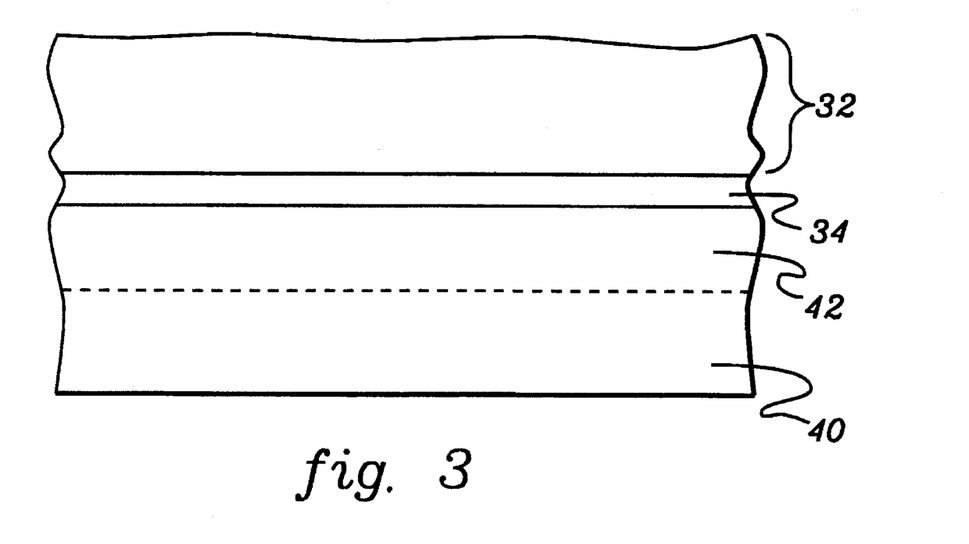
FIG. 3 is a partial cross-sectional view of an interposer substrate in accordance with the present invention for the multichip module of FIG. 1.

Although this fabrication approach minimizes extra fabrication process steps, it may also reduce wiring real estate available for MCM interconnections. As a second option, local interconnections between transistors of the active circuit layer might be provided by an extra level of metal placed below the VDD plane of the multiple layers of interconnect wiring 32. Such wiring is minimal since all power bussing (i.e., approximately half the interconnection circuitry) is provided by access to the broad power wiring planes already existing. Global wiring, such as that to provide clocking and scan access to the embedded circuitry would continue to be provided by the standard (i.e., higher) wiring planes.

Figure 4:
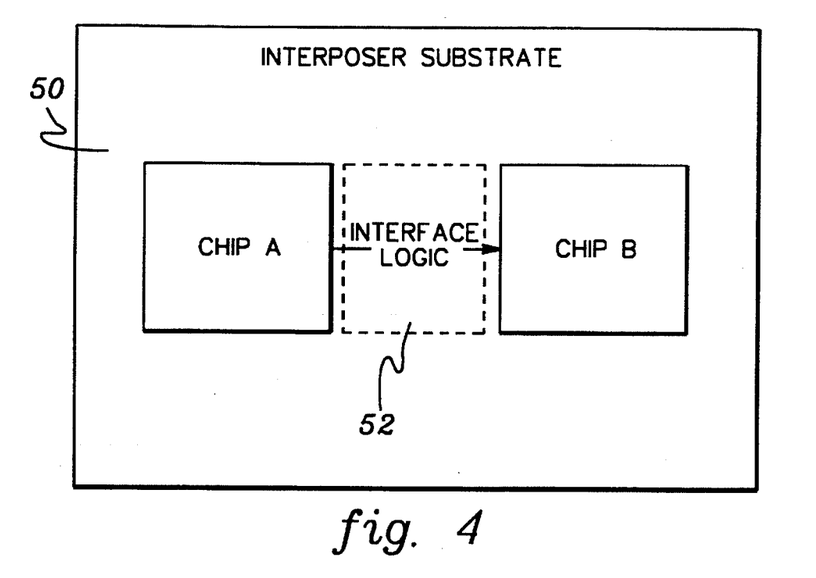
FIG. 4 is a block diagram of an interposer substrate in accordance with the present invention.
Figure 5:
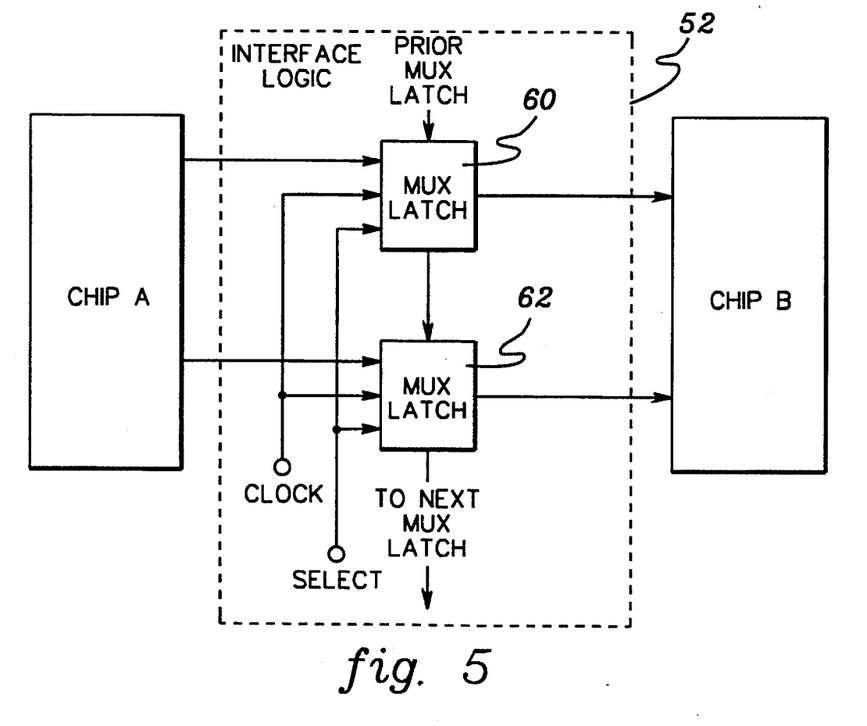
FIG. 5 is a schematic of one embodiment of interface logic in accordance with the present invention, shown interconnecting two integrated circuit chips disposed above the interposer substrate.

The form of circuitry embedded within the interposer substrate must be personalized based upon the nature of the interconnection nets. By way of example, referring to FIG. 4, assume that chip A drives chip B via interface logic 52 (according to this invention) embedded within an interposer substrate 50 upon which chip A and chip B reside. Interface logic 52 is shown in phantom since the circuitry resides within the interposer substrate while, in this embodiment, chips A & B reside above the substrate. One implementation of interface logic 52 in accordance with the present invention is depicted in FIG. 5.

Figure 6:
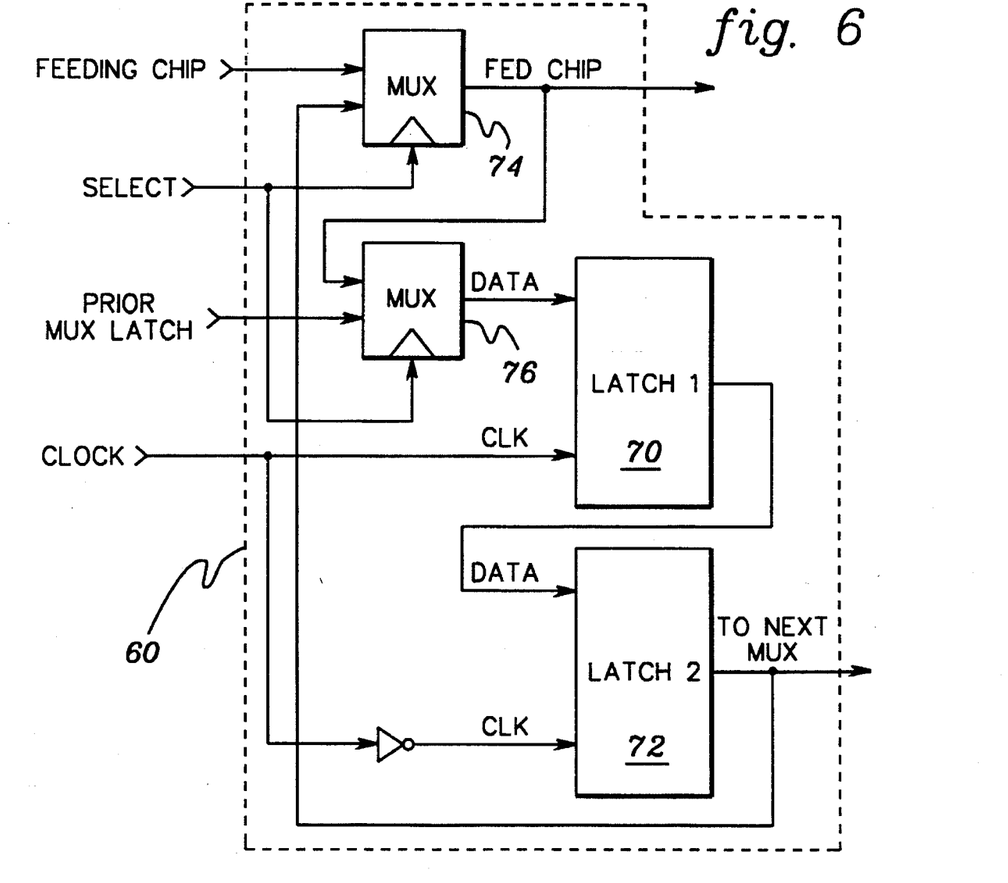
FIG. 6 is a schematic of one embodiment of a multiplexer (MUX) latch for the interface logic of FIG. 5 in accordance with the present invention.

As shown, each chip-to-chip interconnection net feeds a multiplexer (MUX) latch, such as MUX latch 60 or 62, electrically disposed between the chips. These MUX latches 60 & 62 are connected together to form a scan string or shift register string wherein data is latched in parallel and shifted out serially along a scan path from one MUX latch to the next. Control of the latches is provided via a "SELECT" signal and a "CLOCK" signal, both of which are fed to the MUX latches 60, 62, etc. Referring to FIG. 6, one embodiment of a MUX latch 60 includes two edge-triggered flip-flops 70 & 72, along with two multiplexers 74 & 76. Depending upon the state of operation, the "SELECT" signal controls the feeding of information from one chip to the next chip in the MCM. During normal operation, the "SELECT" input to all MUX latches is set such that MUX 74 selects the signal from the feeding chip and feeds the signal directly to the fed chip, thereby not affecting functionality of the multichip module.

However, in the test mode the MUX latches serve as both control and observation ports so that testing may be performed individually for each integrated circuit chip in the multichip module. The stimuli for a given integrated circuit chip is created by setting the "SELECT" line to test mode, and scanning a desired state into the shift register string by pulsing the "CLOCK". The system clock(s) for the chip under test is then cycled until the results of the test appear at the chip outputs. The "SELECT" line is switched to system mode and the "CLOCK" is pulsed once. This drives data from the chip output to MUX latches 60. The resultant state can be determined by then placing the "SELECT" line back into test mode and cycling the substrate clock again, thereby shifting data out of the scan string(s).

Those skilled in the art will note from FIG. 6 that the interface logic presented therein has been designed to minimize the amount of circuitry embedded within the interposer substrate while still providing testing observability and controlability. This is because the more circuitry placed in the substrate, the greater the chance of a defect occurring during manufacturing, which increases associated costs of the manufacturing process.

Figure 7:
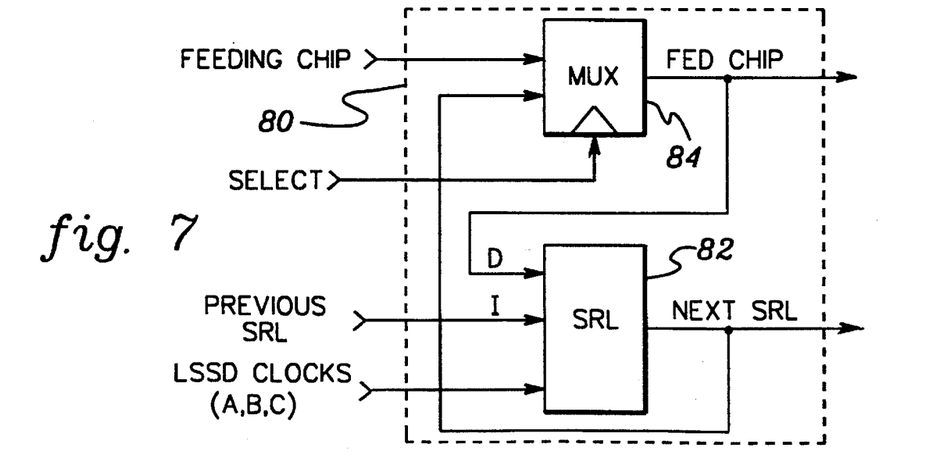
FIG. 7 is a schematic of a level sensitive scan design (LSSD) compliant embodiment of a MUX latch for the interface logic of FIG. 5 in accordance with the present invention.

An alternate, LSSD-compliant version of the interposer substrate's latch circuitry (in accordance with the present invention) is depicted in FIG. 7. This circuitry, generally denoted 80, uses an LSSD-compliant shift register latch (SRL) 82. During system operation, the "SELECT" input is set such that the multiplexer (MUX) 84 selects the signal from the feeding chip and feeds the signal directly to the fed chip, thus not affecting functionality.

In test mode, however, SRL 82 serves as both a control port and an observation port, such that testing may be performed individually for the integrated circuit chips of the MCM. The stimuli for a given chip is created by scanning the desired state into the shift register string by successively pulsing the 'A' "CLOCK" and the 'B' "CLOCK". Clocks 'A' & 'B' moves data from one SRL to a next SRL. The system clocks for the chip under test are cycled until the results of the test appear at the chip outputs. The select line is then switched to system mode and the 'C' clock is pulsed once. This drives data from the chip into the SRLs. The resultant states can then be determined by pulsing the shift 'A' and 'B' clocks, thereby shifting data out of this scan string(s). The choice whether to employ the MUX latch of FIG. 7 or the embodiment of FIG. 6 will in all likelihood be determined based upon the importance of level sensitive scan design (LSSD) compliance to the particular application. The disadvantage to the embodiment of FIG. 7 is that four inputs are needed to implement the design, i.e., one "SELECT" input and three LSSD "CLOCK" inputs (A, B, C).

Figure 8:
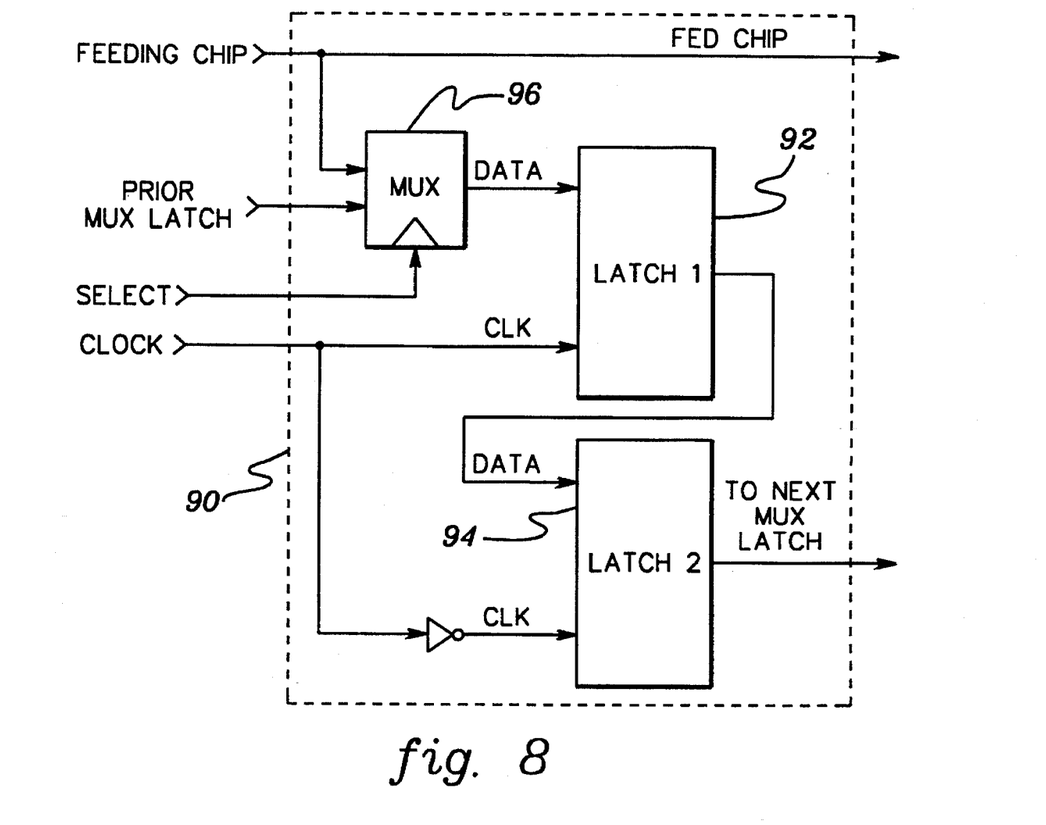
FIG. 8 a schematic of a high performance embodiment of the MUX latch of FIG. 6 in accordance with the present invention.
Figure 9:
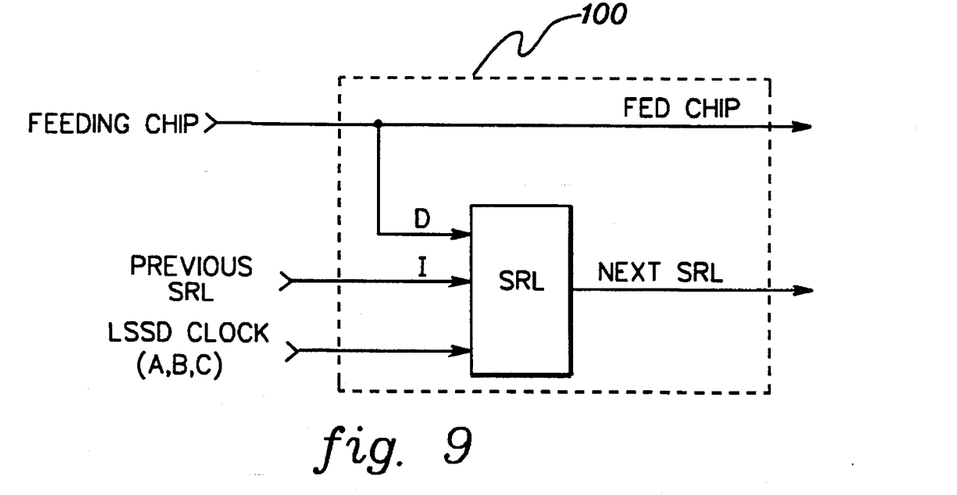
FIG. 9 is a schematic of a high performance embodiment of the LSSD-compliant MUX latch of FIG. 7 in accordance with the present invention.

In certain applications, the existence of a multiplexer within the system data path (as shown in FIG. 6) can sufficiently degrade performance so as to present a problem. In such cases, MUX 74 of MUX latch 60 (FIG. 6) can be eliminated, as presented in MUX latch 90 of FIG. 8. As with the embodiment of FIG. 6, two edge-triggered flip-flops (latch 1 & latch 2) 92 & 94 are employed. In test mode, data is received at "latch 1" 92 from a multiplexer 96 which itself receives data from the feeding chip and the prior MUX latch as selected by the "SELECT" signal. In this embodiment, however, data from the feeding chip is also sent directly to the fed chip. Thus, the substrate circuitry can observe the feeding latch states when in test mode, but cannot be used to independently stimulate the fed chips. FIG. 9 depicts an LSSD-compliant version 100 of the latch circuitry of FIG. 8.

To again summarize, this invention provides test circuitry disposed within the MCM's interposer substrate for MCM fabrication level testing of the integrated circuit chips of the multichip module and for testing the interconnect wiring between the integrated circuit chips. Testability is provided without significantly impacting MCM functionality and performance. Further, no modification to the chip design(s) is necessary to accomplish testing in accordance with this invention. Although disposed within the interposer substrate, active test circuitry is minimized. MCM chip testing pursuant to this invention advantageously incorporates existing testing approaches employed at the chip level of packaging.

By taking advantage of the ability to add circuitry to the interposer substrate, it is possible to independently test each integrated circuit chip (as if probe pads were available), without the additional expense of actually contacting the chips from above. Furthermore, the interposer substrate circuitry provides 100% testing of the interconnect circuitry. As opposed to forcing redesign for testability, the approach disclosed herein is essentially transparent to the integrated circuit chip designs, its only effect in some embodiments being the signal propagation delay of a single multiplexer.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A multichip module comprising:

an interposer substrate;

a plurality of integrated circuit chips disposed above the interposer substrate and electrically interconnected; and semiconductor logic circuitry disposed within the interposer substrate and electrically connected to at least some integrated circuit chips of the plurality of integrated circuit chips, said semiconductor logic circuitry facilitating testing of the multichip module, the semiconductor logic circuitry including at least one test circuit for accepting an input signal from a source chip of the at least some integrated circuit chips and for providing an output signal for a destination chip of the at least some integrated circuit chips, the at least one test circuit further including:

a first multiplexer having a first input for the input signal, a second input, and an output for the output signal;

a second multiplexer having a first input connected to the output of the first multiplexer, a second input for accepting a shift input, and an output; and latch means having a data input connected to the output of the second multiplexer, and an output for providing a shift output, the output of the latch means being coupled to the second input of the first multiplexer such that:

the input signal from the source chip can be sensed by the latch means by selecting the first input of the first multiplexer; and the output signal for the destination chip can be provided by the latch memos by selecting the second input of the first multiplexer.

2. The multichip module of claim 1, wherein said interposer substrate includes interconnect wiring, said interconnect wiring electrically interconnecting the plurality of integrated circuit chips disposed above the interposer substrate and electrically connecting the semiconductor logic circuitry to said at least some integrated circuit chips of the plurality of integrated circuit chips.

3. The multichip module of claim 2, wherein said interconnect wiring comprises a plurality of chip-to-chip interconnection nets and wherein said semiconductor logic circuitry is electrically connected to at least some of said chip-to-chip interconnection nets.

4. The multichip module of claim 1, wherein said semiconductor logic circuitry includes means for observing output of a first integrated circuit chip of said plurality of integrated circuit chips, and means for controlling input to a second integrated circuit chip of said plurality of integrated circuit chips, said second integrated circuit chip being coupled to said first integrated circuit chip across an associated chip-to-chip interconnection net such that said second integrated circuit chip receives as input output from said first integrated circuit chip.

5. The multichip module of claim 1, wherein said latch means include two latches, said two latches comprising edge-triggered flip-flops.

6. The multichip module of claim 1, wherein said latch means includes a shift register latch.

7. The multichip module of claim 1, wherein said plurality of integrated circuit chips are electrically interconnected via chip-to-chip interconnection nets, and wherein said semiconductor logic circuitry includes means for observing signals on at least some of said chip-to-chip interconnection nets.

8. The multichip module of claim 7, wherein said means for observing includes separate latch means associated with each chip-to-chip interconnection net of said at least some chip-to-chip interconnection nets.

9. The multichip module of claim 8, wherein each of said latch means comprises two edge-triggered flip-flops.

10. The multichip module of claim 8, wherein each of said latch means comprises an LSSD-compliant shift register latch.

11. The multichip module of claim 1, wherein the plurality of integrated circuit chips are electrically interconnected via multiple chip-to-chip interconnection nets, and wherein said semiconductor logic circuitry comprises separate latch means coupled to at least some of said chip-to-chip interconnection nets, said separate latch means being coupled together to form a scan string, said scan string having a single input and a single output, wherein test signals from the at least some chip-to-chip interconnection nets are latched in parallel in said scan string and subsequently serially read from said scan string.

12. The multichip module of claim 11, wherein said semiconductor logic circuitry is LSSD-compliant, and wherein each of said separate latch means comprises a shift register latch.

13. The multichip module of claim 1, wherein the plurality of integrated circuit chips are electrically interconnected via multiple chip-to-chip interconnection nets, and wherein said semiconductor logic circuitry comprises separate latch means coupled to at least some of said chip-to-chip interconnection nets, said separate latch means being coupled together to form at least two scan strings, each of said at least two scan strings having a single input and a single output, wherein test signals from the at least some chip-to-chip interconnection nets are latched in parallel in said at least two scan strings and subsequently serially read from each of said at least two scan strings.

14. A multichip module of claim 1, further comprising a carrier for said interposer substrate, and means for hermetically sealing the plurality of integrated circuit chips and the interposer substrate within said carrier.

15. The multichip module of claim 1, wherein the first and second multiplexers are commonly controlled by a select signal, the select signal placing the first and second multiplexers in one of two modes including:

a first mode wherein the first inputs are coupled to the output of their respective multiplexer; and a second mode wherein the second inputs are coupled to the output of their respective multiplexer.

16. The multichip module of claim 15, wherein the latch means comprises two edge-triggered latches controlled by opposite phases of a clock signal.

17. A method for fabricating a multichip module, said method comprising the steps of:

(a) forming a semiconductor substrate having test circuitry disposed therein;

(b) forming interconnect wiring above the semiconductor substrate such that said interconnect wiring electrically connects with said test circuitry disposed within said semiconductor substrate; and (c) disposing a plurality of integrated circuit chips above the interconnect wiring such that the interconnect wiring electrically interconnects said plurality of integrated circuit chips and electrically connects said test circuitry to at least some integrated circuit chips of said plurality of integrated circuit chips, wherein said test circuitry facilitates testing of said plurality of integrated circuit chips, the semiconductor logic circuitry including at least one test circuit for accepting an input signal from a source chip of the at least some integrated circuit chips and for providing an output signal for a destination chip of the at least some integrated circuit chips, the at least one test circuit further including:

a first multiplexer having a first input for the input signal, a second input, and an output for the output signal;

a second multiplexer having a first input connected to the output of the first multiplexer, a second input for accepting a shift input, and an output; and latch means having a data input connected to the output of the second multiplexer, and an output for providing a shift output, the output of the latch means being coupled to the second input of the first multiplexer such that:

the input signal from the source chip can be sensed by the latch means by selecting the first input of the first multiplexer; and the output signal for the destination chip can be provided by the latch means by selecting the second input of the first multiplexer.

18. The fabrication method of claim 17, further comprising the step of testing the plurality of integrated circuit chips and the interconnect wiring subsequent to said disposing step (c), said testing employing said test circuitry disposed within the semiconductor substrate.

19. The method of claim 17, wherein said forming step (a) includes forming said semiconductor substrate of silicon, and forming said test circuitry disposed therein to comprise a latch scan string.

20. The method of claim 17, wherein the first and second multiplexers are commonly controlled by a select signal, the select signal placing the first and second multiplexers in one of two modes including:

a first mode wherein the first inputs are coupled to the output of their respective multiplexer; and a second mode wherein the second inputs are coupled to the output of their respective multiplexer.

21. The method of claim 20, wherein the latch means comprises two edge-triggered latches controlled by opposite phases of a clock signal.

22. A multichip module comprising:

an interposer substrate;

a plurality of integrated circuit chips disposed above the interposer substrate and electrically interconnected; and semiconductor logic circuitry disposed within the interposer substrate and electrically connected to at least some integrated circuit chips of the plurality of integrated circuit chips, said semiconductor logic circuitry facilitating testing of the multichip module, the semiconductor logic circuitry including at least one test circuit for accepting an input signal from a source chip of the at least some integrated circuit chips and for providing an output signal for a destination chip of the at least some integrated circuit chips, the at least one test circuit further including:

a first multiplexer having a first input for the input signal, a second input, and an output for the output signal; and latch means having at least one clock input, a data input connected to the output of the first multiplexer, a shift input, and an output for providing a shift output, the output of the latch means being coupled to the second input of the first multiplexer such that:

the input signal from the source chip can be sensed by the latch means by selecting the first input of the first multiplexer; and the output signal for the destination chip can be provided by the latch means by selecting the second input of the first multiplexer.

23. The multichip module of claim 22, wherein the latch means comprises an LSSD-compliant shift register latch and the at least one clock input comprises A, B and C clock inputs for the shift register latch.

24. The multichip module of claim 23, wherein a select signal is employed to select either the first or second input of the first multiplexer.

* * * * *

UNITED STATES PATENT AND TRADEMARK OFFICE
CERTIFICATE OF CORRECTION

PATENT NO.   :   5,517,515
DATED        :   May 14, 1996
INVENTOR(S)  :   Spall et al.

It is certified that error appears in the above-indentified patent and that said Letters Patent is hereby corrected as shown below:

In the Claims:

Column 7, line 56, delete "memos" and substitute therefor --means--.

Signed and Sealed this

Third Day of September, 1996

Attest:

BRUCE LEHMAN

*Attesting Officer*   *Commissioner of Patents and Trademarks*